United States Patent
Takechi et al.

(10) Patent No.: US 12,193,163 B2
(45) Date of Patent: Jan. 7, 2025

(54) MOUNTING HEAD, MOUNTING APPARATUS, AND METHOD OF MANUFACTURING ELECTRONIC DEVICE

(71) Applicant: Panasonic Intellectual Property Management Co., Ltd., Osaka (JP)

(72) Inventors: Yusuke Takechi, Osaka (JP); Ryo Fujita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 31 days.

(21) Appl. No.: 17/804,856

(22) Filed: Jun. 1, 2022

(65) Prior Publication Data
US 2022/0408621 A1    Dec. 22, 2022

(30) Foreign Application Priority Data

Jun. 18, 2021  (JP) .................. 2021-101833

(51) Int. Cl.
*H01F 7/06* (2006.01)
*H05K 13/04* (2006.01)
*H05K 13/08* (2006.01)

(52) U.S. Cl.
CPC ..... *H05K 13/0812* (2018.08); *H05K 13/0406* (2018.08); *H05K 13/046* (2013.01); *H05K 13/0815* (2018.08)

(58) Field of Classification Search
CPC ............ H05K 13/0406; H05K 13/046; H05K 13/0812; H05K 13/0815
See application file for complete search history.

(56) References Cited

U.S. PATENT DOCUMENTS

| | | | |
|---|---|---|---|
| 7,752,748 B2 * | 7/2010 | Yamasaki | H05K 13/0812 356/614 |
| 8,151,451 B2 * | 4/2012 | Noda | H01L 24/75 29/739 |
| 2005/0071991 A1 * | 4/2005 | Yonezawa | H05K 13/082 29/721 |
| 2005/0097728 A1 | 5/2005 | Ito et al. | |
| 2017/0154865 A1 | 6/2017 | Sato et al. | |

FOREIGN PATENT DOCUMENTS

| | | |
|---|---|---|
| JP | 5-235064 | 9/1993 |
| JP | 2002-043336 | 2/2002 |
| JP | 2004-158743 | 6/2004 |
| JP | 2005-142313 | 6/2005 |
| JP | 2016-040821 | 3/2016 |
| JP | 2017-011137 | 1/2017 |
| WO | 2008/120528 | 10/2008 |

* cited by examiner

*Primary Examiner* — Paul D Kim
(74) *Attorney, Agent, or Firm* — Wenderoth, Lind & Ponack, L.L.P.

(57) ABSTRACT

A mounting head includes a drive part that moves in a vertical direction to apply a load to an electronic component, a float part supported by the drive part in a vertically movable manner, and a linear motor that applies a vertical upward pressing force to the float part. The linear motor includes a stator fixed on the drive part and a moving member fixed on the float part. The drive part moves downward in the vertical direction to apply the load due to own weight of the float part to the electronic component to mount the electronic component onto the board. The linear motor is driven to control a magnitude of the load applied to the electronic component by applying the vertical upward pressing force to the float part.

7 Claims, 8 Drawing Sheets

MOUNTING HEAD, MOUNTING APPARATUS, AND METHOD OF MANUFACTURING ELECTRONIC DEVICE

BACKGROUND

1. Technical Field

The present disclosure relates to a mounting head configured to mount an electronic component such as a semiconductor chip on a board, a mounting apparatus employing the mounting head, and a method of manufacturing an electronic device in which the electronic component is mounted on the board using the mounting head.

2. Description of the Related Art

It has been known that a mounting head employing a voice coil motor (linear motor) is capable of applying a low load to an electronic component in mounting the electronic component on a board (refer to PTL 1, for example).

The voice coil motor disclosed in PTL 1 includes a stator fixed on a motor holder and a moving member connected to a mounting tool that holds an electronic component. By driving the voice coil motor, the mounting tool connected to the moving member lowers toward a board, and the electronic component held by the mounting tool is pushed onto the board. Here, a relatively low load can be applied to the electronic component by controlling a drive current of the voice coil motor.

CITATION LIST

Patent Literature

PTL 1: Unexamined Japanese Patent Publication No. 2016-040821

SUMMARY

A mounting head according to an exemplary embodiment of the present disclosure includes a drive part that moves in a vertical direction to apply a load to an electronic component, a float part supported by the drive part in a vertically movable manner, a linear motor that applies a vertical upward pressing force to the float part, and a mounting tool that is fixed on the float part and holds the electronic component. The linear motor includes a stator fixed on the drive part and a moving member fixed on the float part. The drive part moves downward in the vertical direction to apply a load due to own weight of the float part to the electronic component to the electronic component onto the board. The linear motor is driven to control a magnitude of the load applied to the electronic component by applying the vertical upward pressing force to the float.

A method of manufacturing an electronic device according to the exemplary embodiment of the present disclosure is a method of manufacturing the electronic device using a mounting head. The electronic device includes an electronic component mounted on a board using a mounting head. The mounting head includes a drive part that moves in a vertical direction to apply a load to the electronic component, a float part supported by the drive part in a vertically movable manner, a linear motor that applies a vertical upward pressing force to the float part, and a mounting tool that is fixed on the float part and holds the electronic component. The linear motor includes a stator fixed on the drive part and a moving member fixed on the float part. The method includes the steps of moving the drive part downward in the vertical direction, and mounting the electronic component on the board by controlling the load due to own weight of the float part applied to the electronic component by driving the linear motor to apply the vertical upward pressing force to the float part.

DETAILED DESCRIPTIONS

In mounting a small and thin electronic component on a board, the electronic component may crack due to an excessive load applied to the electronic component. Therefore, it is necessary to control the load and apply a low load to the electronic component.

The use of a voice coil motor enables to apply the low load to the electronic component. However, a load below resolution that can be output by the voice coil motor is uncontrollable. As electronic components are becoming further smaller and thinner, it is difficult to apply a load low enough to prevent cracking of these components. Accordingly, a mounting head capable of applying further lower load has been expected.

It is therefore an object of the present disclosure to provide a mounting head capable of applying a controlled low load to the electronic component at mounting the electronic component on the board.

An exemplary embodiment of the present disclosure will be detailed below with reference to the drawings. However, the present disclosure is not limited to the exemplary embodiment below. Furthermore, various modifications can be made to the present disclosure without departing from the effect of the present disclosure.

Figure 1:
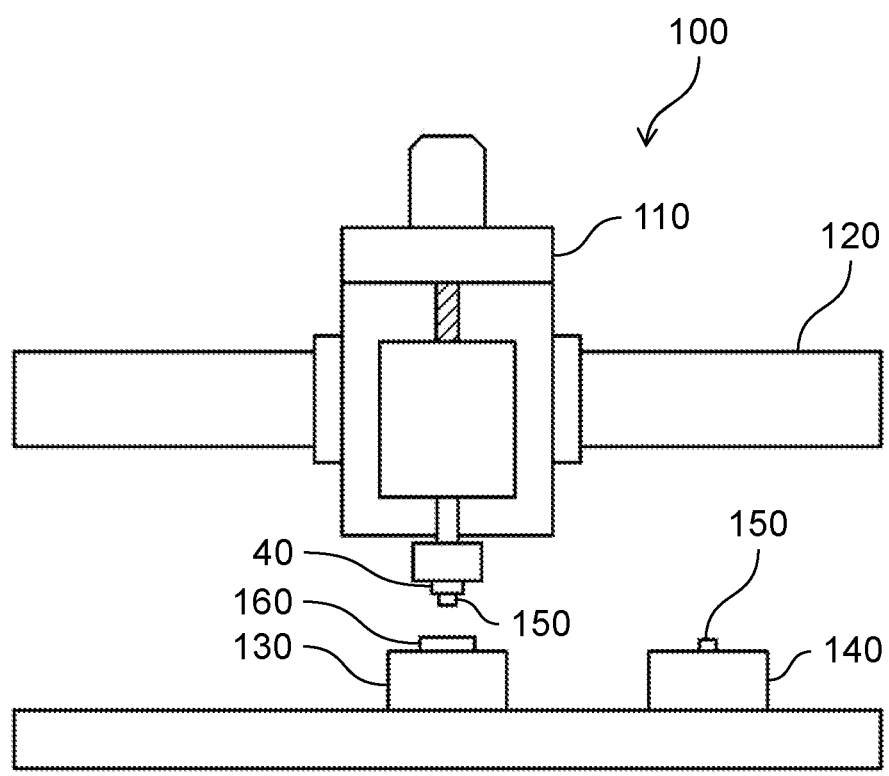
FIG. 1 is a diagram illustrating a configuration of a mounting apparatus equipped with a mounting head according to an exemplary embodiment of the present disclosure.

FIG. 1 is diagram illustrating a configuration of a mounting apparatus equipped with a mounting head according to the exemplary embodiment of the present disclosure.

As illustrated in FIG. 1, mounting apparatus 100 is equipped with mounting head 110 that picks up an electronic component and mounts the electronic component on a board. Mounting head 110 includes mounting tool 40 that picks up and holds the electronic component. Drive shaft 120 (example of a horizontal drive mechanism) controls movement of mounting tool 40 in a horizontal direction. Mounting head 110 moves to above component supply stage 140 to pick up electronic component 150, and then moves to above mounting stage 130 to lower mounting head 110 and mount electronic component 150 held by mounting tool 40 on board 160. Mounting apparatus 100 may be further equipped with a controller that controls mounting head 110. More specifically, the controller may control linear motor 30, mounting tool 40, and servo motor 60 described below by executing a program.

Figure 2:
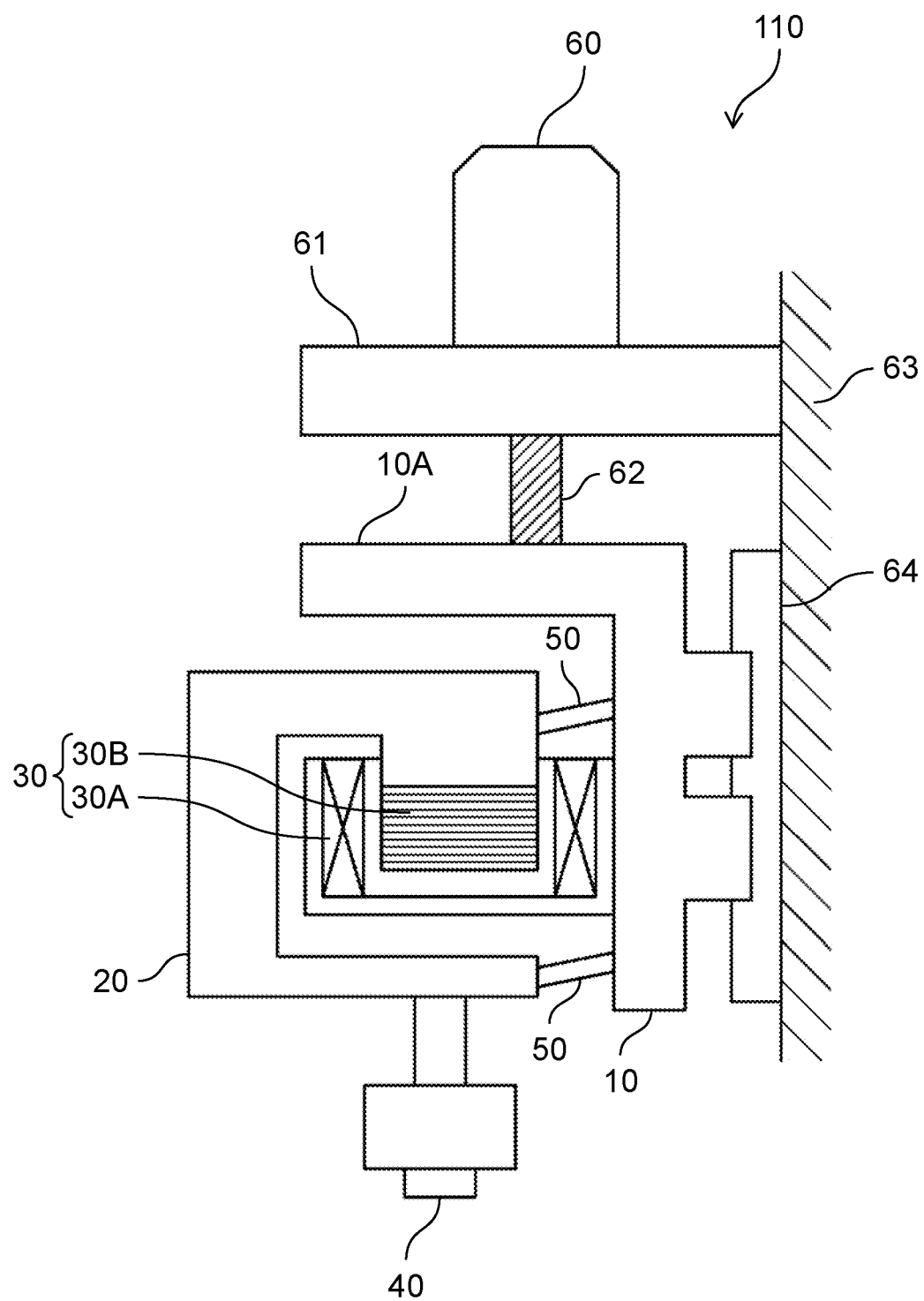
FIG. 2 is a schematic view illustrating a configuration of the mounting head according to the exemplary embodiment.

FIG. 2 is a schematic view illustrating a configuration of mounting head 110 according to the exemplary embodiment.

As illustrated in FIG. 2, mounting head 110 includes drive part 10 that moves in the vertical direction to apply a load to the electronic component, float part 20 supported by drive part 10 in a vertically movable manner, linear motor 30 that applies a vertical upward pressing force to float part 20, and mounting tool 40 that holds the electronic component.

Servo motor 60 that controls vertical movement of drive part 10 is fixed onto frame 63 of mounting apparatus 100 via base 61. Ball screw 62 is connected to an output shaft of servo motor 60, and fixed onto head base 10A of drive part 10. Drive part 10 is connected to guide rail 64 that guides the vertical movement of drive part 10. This configuration enables drive part 10 to move vertically by driving servo motor 60.

Float part 20 is supported by drive part 10 in the vertically movable manner via plate spring 50. Plate spring 50 restricts horizontal movement of float part 20. Note that plate spring 50 preferably has low slidability with respect to vertical movement.

Linear motor 30 is configured with stator 30A in which a permanent magnet is arranged, and moving member 30B includes a coil arranged inside stator 30A. Stator 30A is fixed onto drive part 10 and moving member 30B is fixed onto float part 20. By applying current to the coil, stator 30A can apply the vertical upward pressing force to moving member 30B. Accordingly, the vertical upward pressing force can also be applied to float part 20 onto which moving member 30B is fixed by applying current to the coil. Linear motor 30 is, for example, a voice coil motor.

Mounting tool 40 is connected to float part 20 such that mounting tool 40 is arranged at a lower end of mounting head 110. Mounting tool 40 can perform suction and holding of the electronic component typically by a vacuum suction system.

In the exemplary embodiment, the electronic component is mounted on the board by moving drive part 10 downward in the vertical direction and applying a load due to own weight of float part 20 to the electronic component. At the same time, the vertical upward pressing force is applied to float part 20 by driving linear motor 30. Therefore, load in which the vertical upward pressing force applied to float part 20 is subtracted from the load due to the own weight of float part 20 is actually applied to the electronic component. In other words, a magnitude of the load applied to the electronic component is controlled by the vertical upward pressing force applied to float part 20 by driving linear motor 30.

In the exemplary embodiment, an extremely low load of 0.1 N or less can be accurately controlled and applied to the electronic component at mounting the electronic component on the board by setting the vertical upward pressing force applied to float part 20 close to the load due to the own weight of float part 20. Accordingly, cracking of the electronic component can be prevented even when a very small and thin electronic component is mounted on the board.

Note that the "load due to the own weight of float part 20" in the exemplary embodiment includes a load of moving member 30B because moving member 30B of linear motor 30 is fixed on float part 20.

Next, a process of mounting the electronic component on the board using mounting head 110 according to the exemplary embodiment will be described with reference to FIGS. 3A to 3D.

Figure 3A:
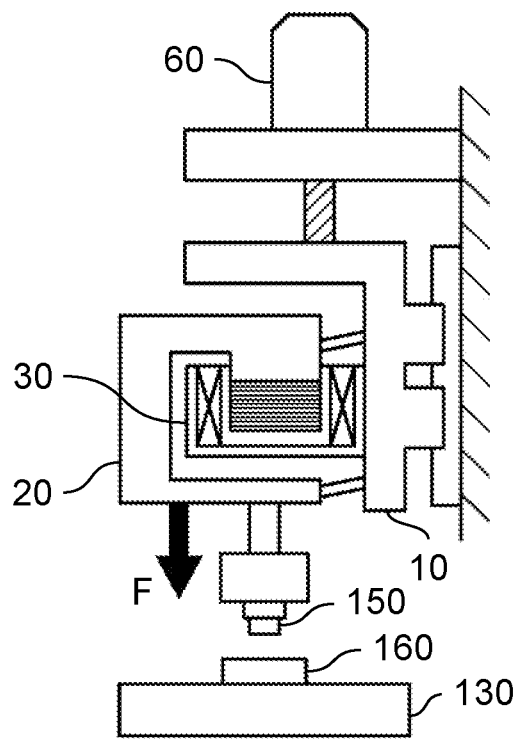
FIG. 3A is a diagram illustrating a process of mounting an electronic component on a board using the mounting head according to the exemplary embodiment.

FIG. 3A illustrates mounting head 110 in a standby state. Mounting head 110 is moved horizontally, and electronic component 150 held by mounting tool 40 is positioned over board 160 placed on mounting stage 130. At this point, drive part 10 is in an elevated state, linear motor 30 is not driven due to a reason described later, and float part 20 is in a lower limit state by load F due to the own weight.

Figure 3B:
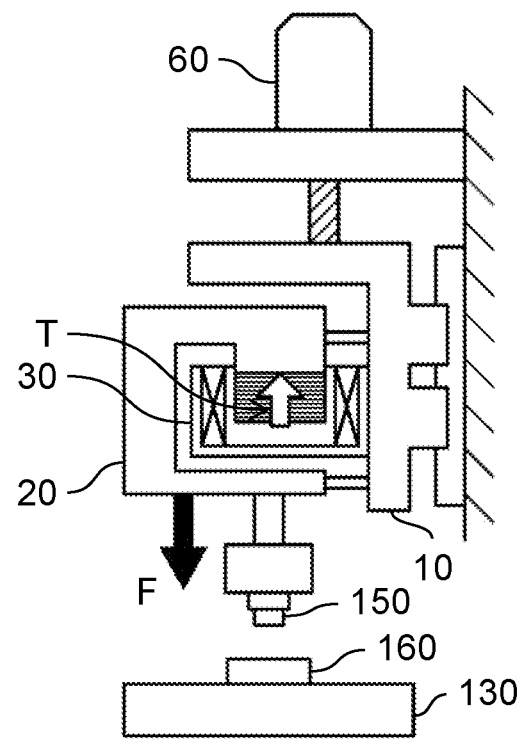
FIG. 3B is a diagram illustrating the process of mounting the electronic component on the board using the mounting head according to the exemplary embodiment.

Next, as illustrated in FIG. 3B, mounting apparatus 100 drives linear motor 30 to apply pressing force T in the vertical upward direction to float part 20. At this point, float part 20 slightly rises from the lower limit state.

Figure 3C:
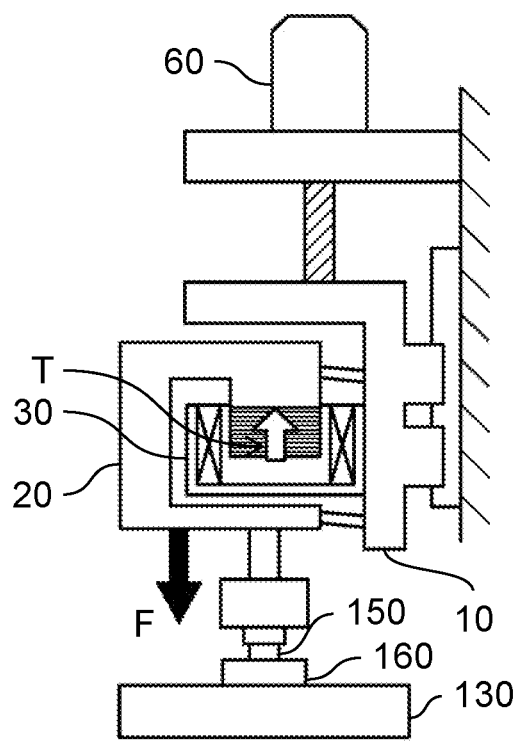
FIG. 3C is a diagram illustrating the process of mounting the electronic component on the board using the mounting head according to the exemplary embodiment.

Next, as illustrated in FIG. 3C, mounting apparatus 100 drives servo motor 60 to lower drive part 10, bring electronic component 150 into contact with board 160, and push in mounting tool 40. At this point, float part 20 rises for a push-in amount, and a load obtained by subtracting pressing force T (T<F) applied to float part 20 from load F due to the own weight of float part 20 is applied to electronic component 150.

Figure 3D:
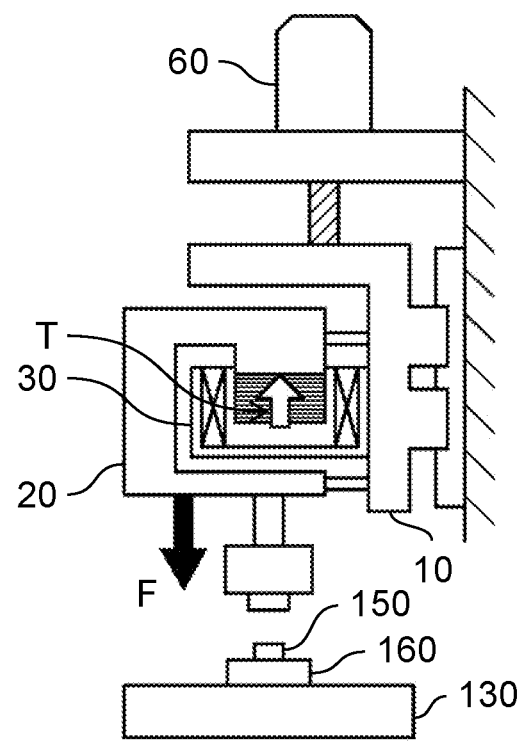
FIG. 3D is a diagram illustrating the process of mounting the electronic component on the board using the mounting head according to the exemplary embodiment.

Next, as illustrated in FIG. 3D, mounting apparatus 100 releases electronic component 150 held by mounting tool 40 to place electronic component 150 on board 160. Then, mounting apparatus 100 drives servo motor 60 to elevate drive part 10. While drive part 10 is elevated, driving of the linear motor may be stopped.

In the exemplary embodiment, mounting apparatus 100 starts to apply pressing force T in the vertical upward direction to float part 20 by linear motor 30 before load F due to the own weight of float part 20 is applied to electronic component 150. Therefore, sudden application of load F due to the own weight of float part 20 to electronic component 150 can be prevented when electronic component 150 comes into contact with board 160.

Note that, in the exemplary embodiment, the "mounting head in the standby state" at least includes movement of mounting head 110 to above component supply stage 140 for picking up electronic component 150 and movement of mounting head 100 to above mounting stage 130 for mounting electronic component 150 picked up onto the board.

When linear motor 30 is continuously driven, the coil of moving member 30B will generate heat, resulting in changing magnetic flux density of the permanent magnet arranged in stator 30A. An output of linear motor 30 may thus become unstable, and accuracy of pressing force T applied to float part 20 may reduce. As a result, accuracy of the load applied to electronic component 150 at mounting may also reduce. Accordingly, driving of linear motor 30 is preferably released when mounting head 110 is in the standby state so that no pressing force T in the vertical upward direction is applied to float part 20.

Modified Example 1

In the above exemplary embodiment, float part 20 is supported by drive part 10 in the vertically movable manner via plate spring 50. Therefore, when mounting head 100 moves at high speed in the horizontal or vertical direction, float part 20 may vibrate. When float part 20 vibrates, a height position of mounting tool 40 in the vertical direction may become unstable or electronic component 150 held by mounting tool 40 may fall.

Figure 4:
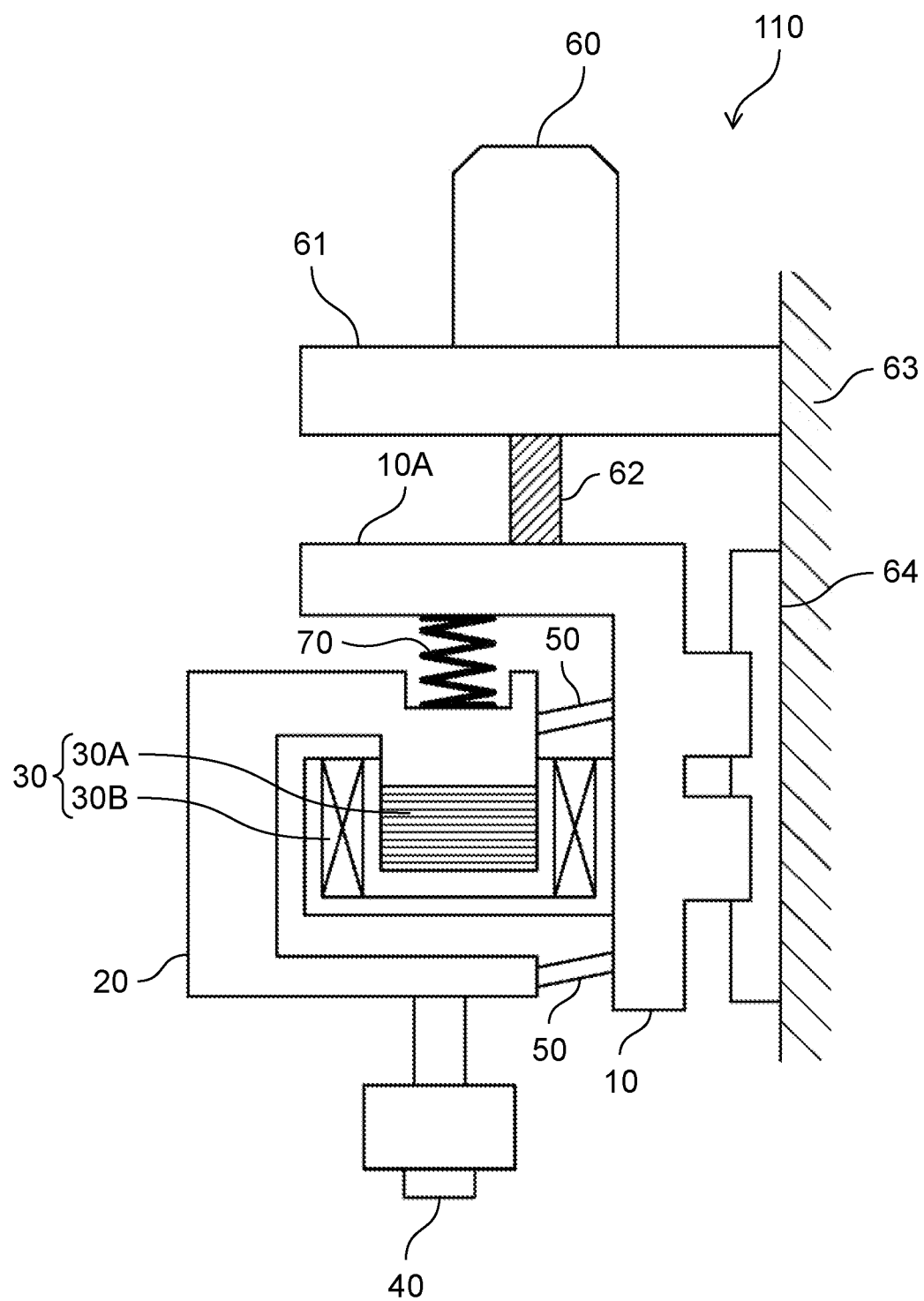
FIG. 4 is a diagram illustrating a configuration of a mounting head according to Modified Example 1 of the present disclosure.

FIG. 4 is a diagram illustrating a configuration of mounting head 110 that can suppress this kind of vibration of float part 20.

As illustrated in FIG. 4, drive part 10 is provided with forcing member 70 to give force in a vertical downward direction to float part 20. More specifically, compression spring 70 is disposed between head base 10A of drive part 10 and float part 20.

Since compression spring 70 continuously gives the force in the vertical downward direction to float part 20 in this way, vibration of float part 20 can be suppressed.

Note that components other than the above are same as those of mounting head 110 in FIG. 2, and thus same reference marks are given to omit duplicate description.

Figure 5:
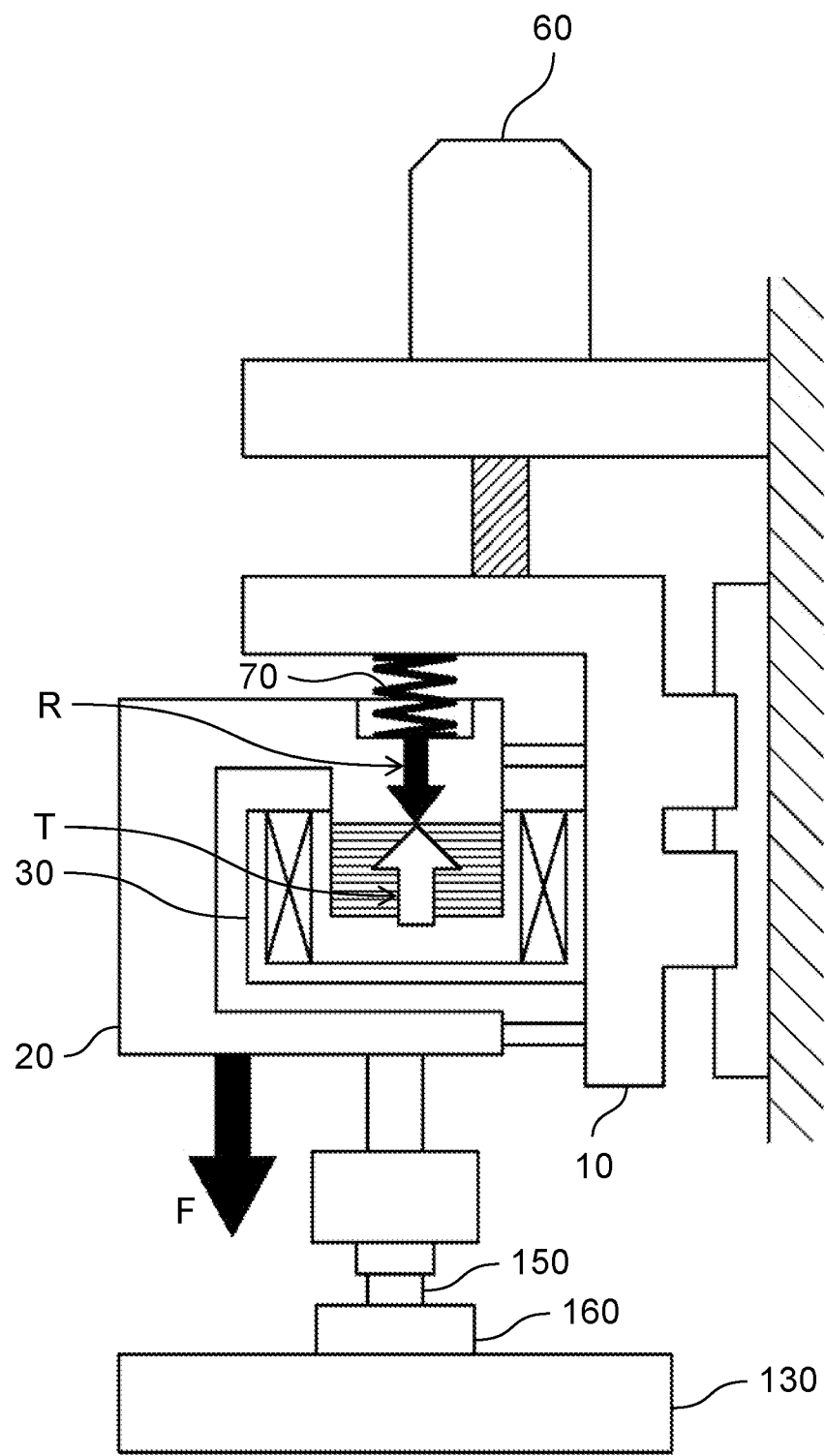
FIG. 5 is a diagram illustrating a process of mounting an electronic component on a board using the mounting head according to Modified Example 1.

FIG. 5 is a diagram corresponding to the mounting process illustrated in FIG. 3C. FIG. 5 illustrates a state that servo motor 60 is driven to lower drive part 10, bring electronic component 150 into contact with board 160, and push in mounting tool 40. At this point, load resulting from subtracting pressing force T (T<F+R) applied to float part 20 from load F due to the own weight of float part 20 and force R caused by compression spring (F+R) is applied to electronic component 150.

Steps other than the above in the mounting process are same as those illustrated in FIGS. 3A to 3D, and thus their description is omitted.

Modified Example 2

Figure 6:
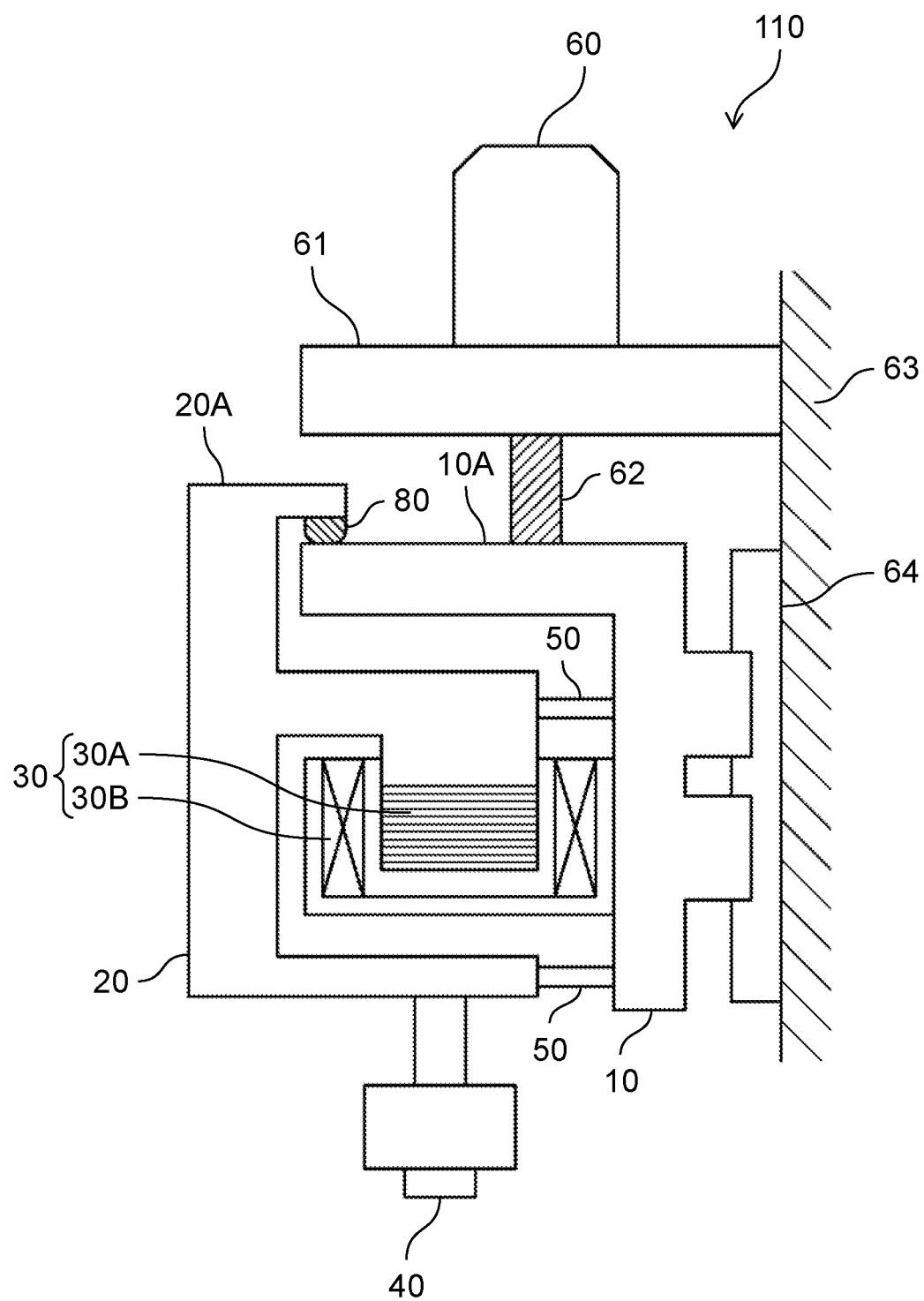
FIG. 6 is a diagram illustrating a configuration of a mounting head according to Modified Example 2 of the present disclosure.

FIG. 6 is a diagram illustrating another configuration of mounting head 110 that can suppress vibration of float part 20.

As illustrated in FIG. 6, drive part 10 has first extending portion (head base) 10A extending in the horizontal direction. Float part 20 has second extending portion 20A provided at a position vertically above first extending portion 10A and including a portion vertically overlapping with first extending portion 10A. In mounting head 110, mechanical stopper 80 with spherical surface is provided on second extending portion 20A.

In Modified Example 2, when the mounting head is in the standby state, mechanical stopper 80 touches first extending portion 10A by the own weight of float part 20 to restrict vertical movement of float part 20. As a result, vibration of float part 20 can be suppressed.

Since mechanical stopper 80 repeatedly touches first extending portion (head base) 10A, both mechanical stopper 80 and first extending portion 10A are preferably formed of a material with high rigidity such as steel so that the position of float part 20 does not deviate due to deformation of the components.

Note that when opposing surfaces of first extending portion 10A and second extending portion 20A are accurately parallel to each other and both first extending portion 10A and second extending portion 20A are formed of a material with high rigidity, first extending portion 10A and second extending portion 20A may directly touch without providing mechanical stopper 80 on second extending portion 20A.

Components other than the above are same as those of mounting head 110 in FIG. 2, and thus same reference marks are given to omit duplicate description.

FIGS. 7A to 7D are diagrams illustrating a process of mounting the electronic component on the board using mounting head 110 according to Modified Example 2.

Figure 7A:
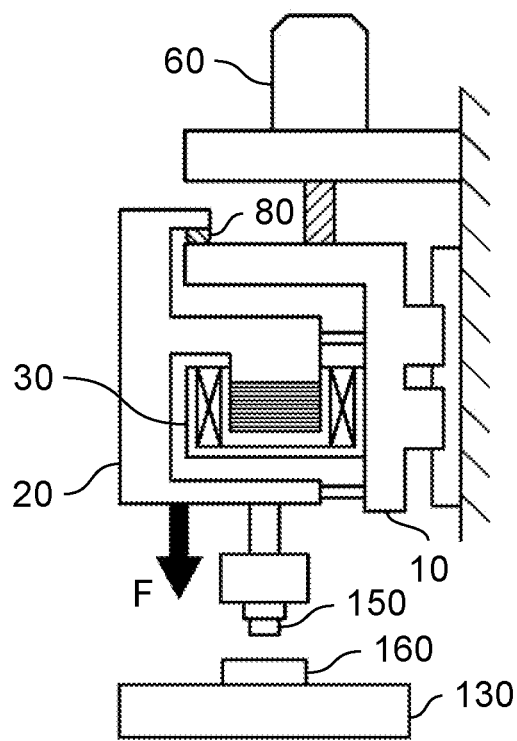
FIG. 7A is a diagram illustrating a process of mounting an electronic component on a board using the mounting head according to Modified Example 2.

FIG. 7A illustrates mounting head 110 in the standby state. Electronic component 150 held by mounting tool 40 is positioned over board 160 placed on mounting stage 130. At this point, linear motor 30 is not driven, and mechanical stopper 80 touches first extending portion 10A of drive part 10 by load F due to the own weight of float part 20, so that vertical movement of float part 20 is restricted.

Figure 7B:
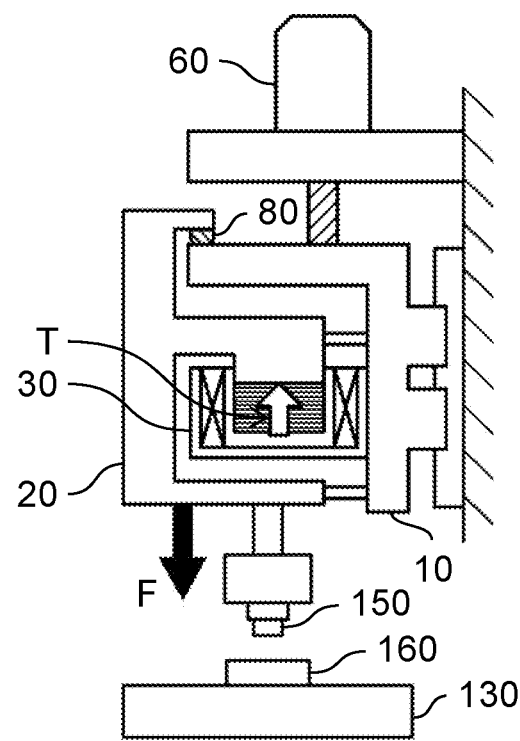
FIG. 7B is a diagram illustrating the process of mounting the electronic component on the board using the mounting head according to Modified Example 2.

Next, as illustrated in FIG. 7B, linear motor 30 is driven to apply pressing force T in the vertical upward direction to float part 20. At this point, load F due to the own weight of float part 20 is set larger than pressing force T applied to float part 20, so that the vertical movement of float part 20 is restricted.

Figure 7C:
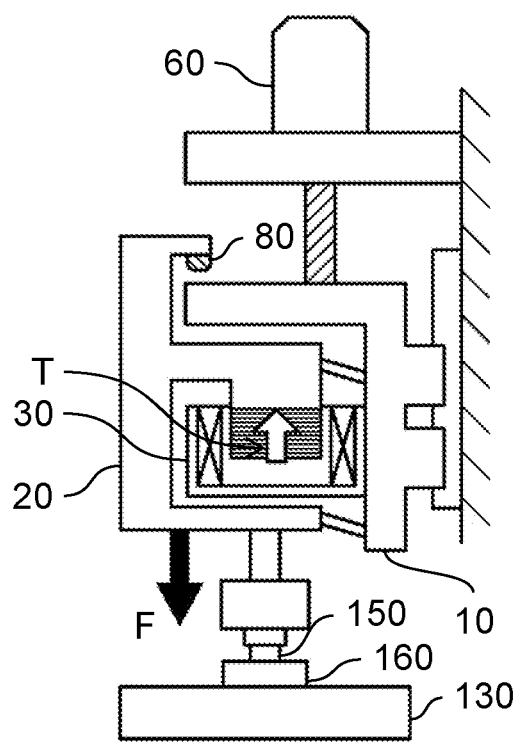
FIG. 7C is a diagram illustrating the process of mounting the electronic component on the board using the mounting head according to Modified Example 2.

Next, as illustrated in FIG. 7C, servo motor 60 is driven to lower drive part 10, bring electronic component 150 into contact with board 160, and push in mounting tool 40. At this point, float part 20 rises for a push-in amount, and mechanical stopper 80 separates from drive part 10. At the same time, the load resulting from subtracting pressing force T (T<F) applied to float part 20 from load F due to the own weight of float part 20 is applied to electronic component 150.

Figure 7D:
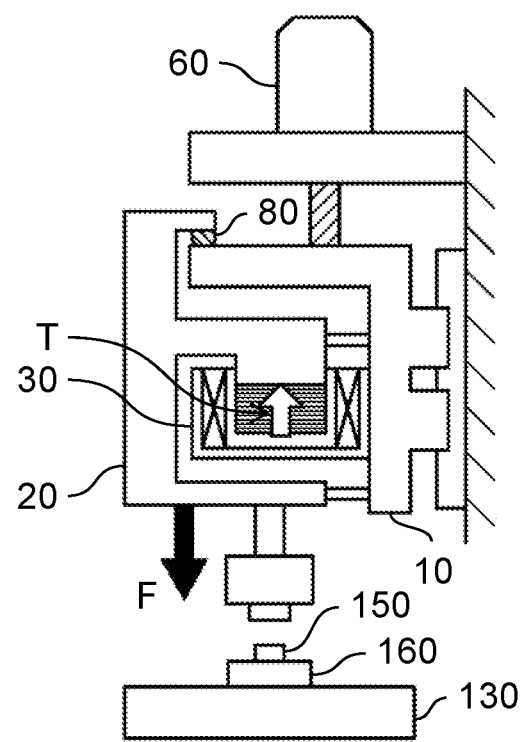
FIG. 7D is a diagram illustrating the process of mounting the electronic component on the board using the mounting head according to Modified Example 2.

Next, as illustrated in FIG. 7D, electronic component 150 held by mounting tool 40 is released to place electronic component 150 on board 160. Then, servo motor 60 is driven to elevate drive part 10. At this point, the vertical movement of float part 20 is restricted by setting load F due to the own weight of float part 20 larger than pressing force T applied to float part 20. Note that driving of the linear motor may be released while drive part 10 is elevated.

Figure 8:
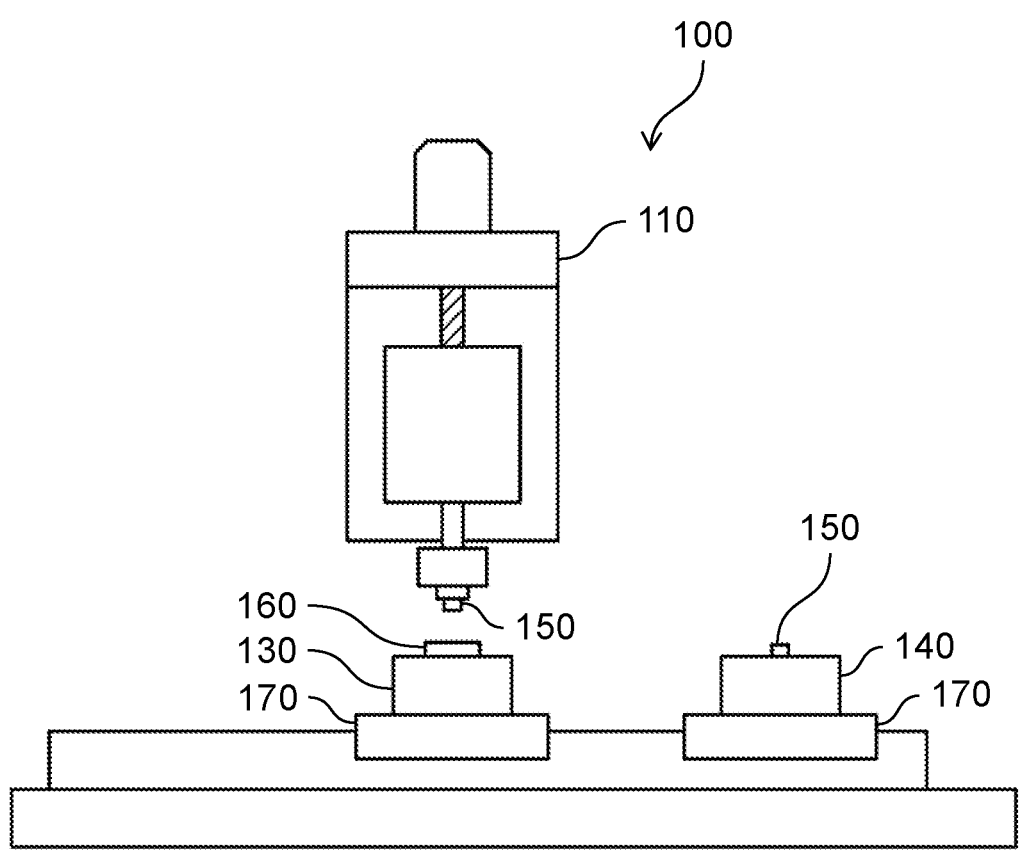
FIG. 8 is a diagram illustrating another configuration of the mounting apparatus equipped with the mounting head according to the exemplary embodiment.

FIG. 8 is a diagram illustrating another configuration of mounting apparatus 100 equipped with mounting head 110 according to the above exemplary embodiment.

As illustrated in FIG. 8, mounting apparatus 100 includes mounting head 110, mounting stage 130, component supply stage 140, and stage drive shaft 170. Mounting stage 130 and component supply stage 140 are disposed on stage drive shaft 170, and both stages can be horizontally moved to immediately below mounting head 110.

Stage drive shaft 170 transfers component supply stage 140 carrying electronic component 150 to immediately below mounting head 110 at picking up electronic component 150. Stage drive shaft 170 transfers mounting stage 130 carrying board 160 to immediately below mounting head 110 at mounting electronic component 150 onto the board.

Mounting apparatus 100 configured in this way does not require to horizontally move mounting head 110 at high speed. Accordingly, vibration of float part 20 due to movement of mounting head 110 can be suppressed.

An electronic device in which electronic component 150 is mounted on board 160 can be manufactured using mounting head 110 according to the exemplary embodiment. In this case, a method of manufacturing the electronic device includes the steps of vertically moving drive part 10, and mounting electronic component 150 onto board 160 by controlling the load applied to electronic component 150 due to the own weight of float part 20 with the pressing force. Liner motor 30 is driven to apply the pressing force in the vertical upward direction to float 20.

The present disclosure offers the mounting head capable of applying a low load to the electronic component in an accurately controlled manner at mounting the electronic component on the board.

The preferred exemplary embodiment of the present disclosure has been described above. However, the description is not restrictive and it is obvious that various changes and modifications are included in the gist of the present disclosure.

10 DRIVE PART
10A HEAD BASE (FIRST EXTENDING PORTION)
20 FLOAT PART
20A SECOND EXTENDING PORTION
30 LINEAR MOTOR
30A STATOR
30B MOVING MEMBER
40 MOUNTING TOOL
50 PLATE SPRING
60 SERVO MOTOR
61 BASE
63 FRAME
64 GUIDE RAIL
70 COMPRESSION SPRING (FORCING MEMBER)
80 MECHANICAL STOPPER
100 MOUNTING APPARATUS
110 MOUNTING HEAD
120 DRIVE SHAFT
130 MOUNTING STAGE
140 COMPONENT SUPPLY STAGE
150 ELECTRONIC COMPONENT
160 BOARD
170 STAGE DRIVE SHAFT

What is claimed is:

1. A mounting head configured to mount an electronic component on a board, the mounting head comprising:
   a drive part that moves in a vertical direction to apply a load to the electronic component;
   a float part supported by the drive part in a vertically movable manner;
   a linear motor that applies a vertical upward pressing force to the float part; and
   a mounting tool that is fixed on the float part and holds the electronic component,
   wherein
   the linear motor includes a stator fixed on the drive part and a moving member fixed on the float part,
   the drive part moves downward in the vertical direction to apply the load due to an own weight of the float part to the electronic component to mount the electronic component onto the board,
   the linear motor is driven to control a magnitude of the load applied to the electronic component by applying the vertical upward pressing force to the float part,
   wherein the linear motor is configured to not apply the vertical upward pressing force to the float part when the mounting head is in a standby state, and
   wherein the linear motor is configured to start to apply the vertical upward pressing force to the float part before the load due to the own weight of the float part is applied to the electronic component.

2. The mounting head according to claim 1, wherein the float part is supported by the drive part in the vertical movable manner via a plate spring.

3. The mounting head according to claim 1, wherein the drive part further includes a forcing member that gives a vertical downward force to the float part.

4. A mounting apparatus comprising:
   the mounting head according to claim 1; and
   a horizontal movement mechanism that horizontally moves the mounting head.

5. A method of manufacturing an electronic device using a mounting head, the electronic device including an electronic component mounted on a board,
   the mounting head including:
   a drive part that moves in a vertical direction to apply a load to the electronic component,
   a float part supported by the drive part in a vertically movable manner,
   a linear motor that applies a vertical upward pressing force to the float part, the linear motor including a stator fixed on the drive part and a moving member fixed on the float part, and
   a mounting tool that is fixed on the float part and holds the electronic component,
   the method comprising:
   moving the drive part downward in the vertical direction;
   mounting the electronic component on the board by controlling the load due to an own weight of the float part applied to the electronic component, the load being controlled by driving the linear motor to apply the vertical upward pressing force to the float part; and
   releasing the driving of the linear motor such that the linear motor does not apply the vertical upward pressing force to the float part when the mounting head is in a standby state,
   wherein the linear motor starts to apply the vertical upward pressing force to the float part before the load due to the own weight of the float part is applied to the electronic component.

6. A mounting head configured to mount an electronic component on a board, the mounting head comprising:
   a drive part that moves in a vertical direction to apply a load to the electronic component;
   a float part supported by the drive part in a vertically movable manner;
   a linear motor that applies a vertical upward pressing force to the float part; and
   a mounting tool that is fixed on the float part and holds the electronic component,
   wherein
   the linear motor includes a stator fixed on the drive part and a moving member fixed on the float part,
   the drive part moves downward in the vertical direction to apply the load due to an own weight of the float part to the electronic component to mount the electronic component onto the board,
   the linear motor is driven to control a magnitude of the load applied to the electronic component by applying the vertical upward pressing force to the float part, and
   wherein the linear motor is configured to start to apply the vertical upward pressing force to the float part before the load due to the own weight of the float part is applied to the electronic component.

7. A method of manufacturing an electronic device using a mounting head, the electronic device including an electronic component mounted on a board, the mounting head including:
a drive part that moves in a vertical direction to apply a load to the electronic component,
a float part supported by the drive part in a vertically movable manner,
a linear motor that applies a vertical upward pressing force to the float part, the linear motor including a stator fixed on the drive part and a moving member fixed on the float part, and
a mounting tool that is fixed on the float part and holds the electronic component, the method comprising:
moving the drive part downward in the vertical direction; and
mounting the electronic component on the board by controlling the load due to an own weight of the float part applied to the electronic component, the load being controlled by driving the linear motor to apply the vertical upward pressing force to the float part,
wherein the linear motor starts to apply the vertical upward pressing force to the float part before the load due to the own weight of the float part is applied to the electronic component.

* * * * *